United States Patent [19]

Nishi

[11] Patent Number: 5,286,988
[45] Date of Patent: Feb. 15, 1994

[54] CHARGE COUPLED DEVICE IMAGE SENSOR

[75] Inventor: Naoki Nishi, Kanagawa, Japan

[73] Assignee: Sony Corporation, Tokyo, Japan

[21] Appl. No.: 902,666

[22] Filed: Jun. 22, 1992

[30] Foreign Application Priority Data

Jun. 21, 1991 [JP] Japan .................................. 3-177177

[51] Int. Cl.$^5$ .................. H01L 29/796; H01L 27/14; H01L 31/00
[52] U.S. Cl. .................. 257/223; 257/224; 257/233; 257/250
[58] Field of Search .......... 357/24, 30; 377/57-63; 257/222, 223, 232, 233

[56] References Cited

U.S. PATENT DOCUMENTS

| 4,518,978 | 5/1985 | Takeshita | 357/24 |
| 4,935,794 | 6/1990 | Miyatake | 357/24 |
| 5,132,762 | 7/1992 | Yamada | 357/24 |
| 5,181,093 | 1/1993 | Kawaura | 257/223 |
| 5,191,399 | 3/1993 | Maegawa et al. | 257/223 |

FOREIGN PATENT DOCUMENTS 0265271  4/1988  European Pat. Off. .
WO91/03839  3/1991  PCT Int'l Appl. .

Primary Examiner—Gene M. Munson
Attorney, Agent, or Firm—Hill, Steadman & Simpson

[57] ABSTRACT

The present invention provides a CCD image sensor capable of suppressing the anomalous increase of the quantity of electric charges to be dealt with by sensor elements when a large quantity of light falls thereon without reducing the quantity of electric charges to be dealt with by vertical transfer registers and without increasing the amplitude of a pulse to be applied to the substrate when an electronic shutter operation is performed. The CCD image sensor is provided with sensor elements (1) of a HAD construction each having a hole accumulating layer (13) and arranged in vertical and horizontal rows, and heavily doped HCS regions (19) of the same type of conduction as that of the hole accumulating layers (13), formed in areas between the adjacent sensor elements of each vertical row to secure passages having a sufficient capacity for holes produced by photoelectric conversion so that the resistance against the hole current is reduced.

2 Claims, 4 Drawing Sheets

FIG. IA
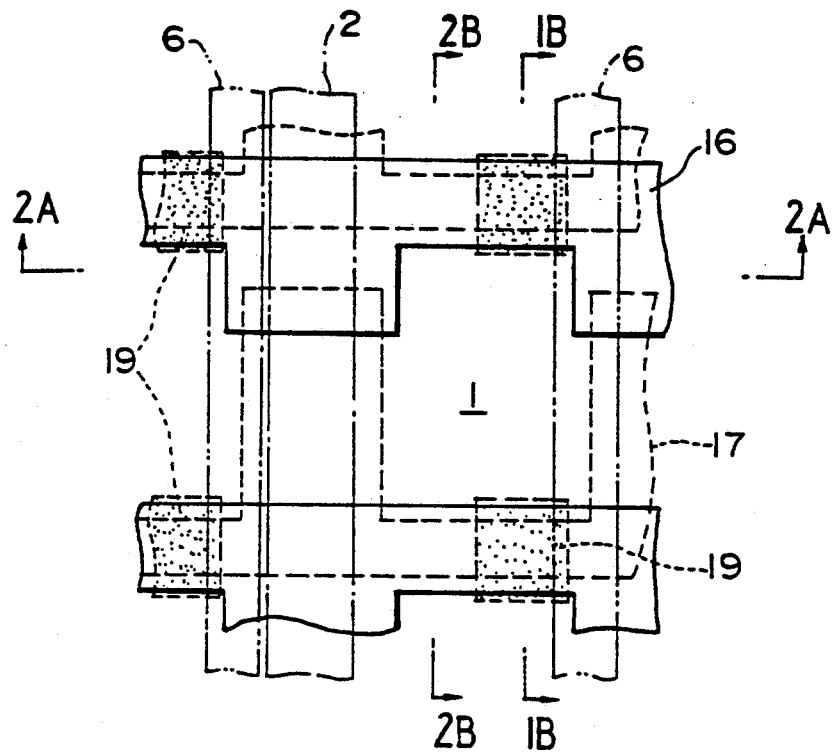
FIG. IB
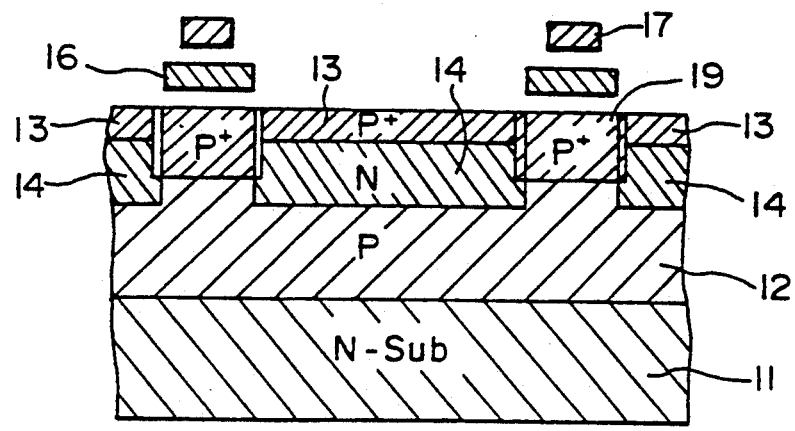

CHARGE COUPLED DEVICE IMAGE SENSOR

BACKGROUND OF THE INVENTION

1. Field of the Invention

The present invention relates generally to a solid-state image sensor and, more particularly, to the structure of the sensor elements of a hole accumulation diode construction (HAD construction) of a charge coupled device image sensor (CCD image sensor).

2. Description of the Prior Art

FIG. 3 shows the structure of a CCD image sensor of an interline transfer system. Referring to FIG. 3, the CCD image sensor has an image sensing unit 3 comprising a plurality of sensor elements 1 arranged in vertical and horizontal rows in a two-dimensional arrangement to accumulate electric signal charges corresponding to the quantity of incident light, and a plurality of vertical shift registers (vertical transfer units) 2 each connected to the sensor elements 1 in each vertical row to transfer electric signal charges read from the sensor elements 1 of the corresponding vertical row.

The electric signal charges produced by the sensor elements 1 through photoelectric conversion are read instantaneously in a vertical blanking interval by the vertical shift register. The electric signal charges corresponding to one scanning line among those read by the vertical shift register 2 are transferred to a horizontal shift register 4 in each horizontal blanking interval. The electric signal charges corresponding to one scanning line are transferred sequentially in a horizontal direction by the horizontal shift register 4. An output circuit 5, such as a floating diffusion amplifier (FDA) or the like, is connected to the output end of the horizontal shift register 4. The output circuit 5 detects the electric signal charges obtained by the sensor elements 1 through photoelectric conversion and transferred by the vertical shift registers 2 and the horizontal shift register 4, and converts the electric signal charges into corresponding electric signals and provides television signals.

As shown in FIG. 4, holes produced in the sensor element 1 by the light received by the sensor element 1 are discharged through a channel stop region 6 to the ground (GND) of the CCD image sensor. Since a p-type region serving as the channel stop region 6 has a low impurity concentration and a small width, the resistance against the the hole current is relatively high. Accordingly, when a large quantity of light falls on the sensor element 1, the surface potential of the sensor element 1 varies and the operating characteristics of the sensor element 1 change because the potential of the channel stop region 6 is caused to change by the hole current. Consequently, an extraordinarily large quantity of electric charges is accumulated in the sensor element 1, causing electric signal charges to overflow the vertical shift register 2 (vertical CCD).

A prior art CCD image sensor is provided with sensor elements 1 having channel stop regions 6 formed in a high impurity concentration to reduce the resistance against the hole current produced through photoelectric conversion. As shown in FIGS. 5(a) and 5(b), a p+-type channel stop region 7 having a high impurity concentration higher than that of the channel stop region 6 is formed in the inner portion of the channel stop region 6 to reduce the resistance against the hole current. However, when the CCD image sensor is subjected to heat treatment in a semiconductor device fabricating process, the anomalous diffusion of the impurity contained in the p+-type channel stop region 7 occurs to spoil the vertical shift register 2 (vertical CCD). Consequently, the effective width of the vertical shift register 2 is reduced and the quantity of electric charges to be dealt with by the vertical shift register 2 is reduced.

The sensor elements 1 are spoiled likewise by the anomalous diffusion of the impurity contained in the p+-type channel stop region 7. Consequently, when an electronic shutter operation is performed to discharge the electric signal charges accumulated in the sensor elements 1 into the semiconductor substrate, capacitive coupling is produced to increase the capacitance of the channel stop region 6. Therefore, the overflow barrier will not readily collapse even if the amplitude of a voltage pulse applied to the semiconductor substrate is increased and hence a voltage pulse having a still larger amplitude must be applied to the semiconductor substrate.

SUMMARY OF THE INVENTION

Accordingly, it is an object of the present invention to provide a CCD image sensor capable of suppressing the anomalous increase of the quantity of electric charges to be dealt with by its sensor elements when a large quantity of light falls thereon, without reducing the quantity of electric charges to be dealt with by its vertical transfer registers and without requiring the enhancement of the amplitude of pulses to be applied to its substrate when an electronic shutter operation is performed.

A CCD image sensor in one aspect of the present invention comprises a plurality of sensor elements each having an electric signal charge accumulating region for accumulating electric signal charges produced through photoelectric conversion and hole accumulating layer formed on the electric signal charge accumulating region, and arranged in vertical and horizontal rows in a two-dimensional arrangement; and vertical shift registers for vertically transferring the electric signal charges read from the sensor elements in the vertical rows; wherein the hole accumulating regions of the plurality of sensor elements in the vertical rows are connected, and additional regions doped in a high impurity concentration in the same type of conduction as that of the hole accumulating layer are formed in regions between the sensor elements.

In the CCD image sensor in accordance with the present invention, the resistance against the hole current is reduced by the additional regions doped in a high impurity concentration in the same type of conduction as that of the hole accumulating layer and formed between the vertical rows of the sensor elements, to use the hole accumulating layer formed on the electric signal charge accumulating regions as passages for holes as well as means for reducing dark current in the sensor elements. Accordingly, the impurity concentration of the channel stop regions need not be increased, so that the anomalous increase of the quantity of electric charges to be dealt with by the sensor elements when a large quantity of light falls on the CCD image sensor can be suppressed without entailing reduction in the quantity of electric charges to be dealt with by the vertical shift registers, and increase in the amplitude of the pulse to be applied to the substrate when an electronic shutter operation is performed.

BRIEF DESCRIPTION OF THE DRAWINGS

The above and other objects, features and advantages of the present invention will become more apparent from the following description taken in connection with the accompanying drawings, in which:

FIG. 1(a) is a plan view of a sensor element, which corresponds to one picture element, of the image sensing unit of a CCD image sensor in a preferred embodiment according to the present invention;

FIG. 1(b) is a sectional view taken on line Y—Y in FIG. 1(a);

DESCRIPTION OF THE PREFERRED EMBODIMENTS

Figure 2A:
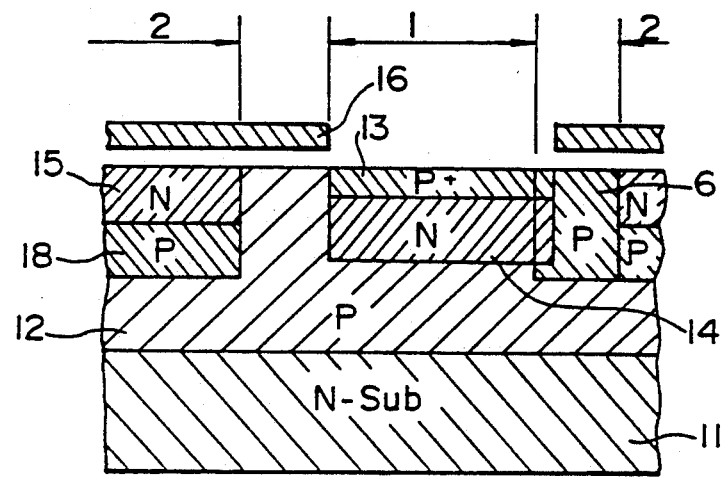
FIG. 2(a) is a sectional view taken on line X—X in FIG. 1(a)
Figure 2B:
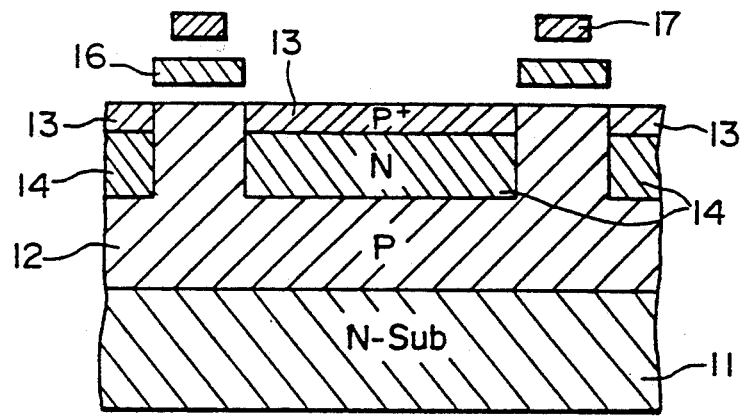
FIG. 2(b) is a sectional view taken on line Y'—Y' in FIG. 1(a)
Figure 3:
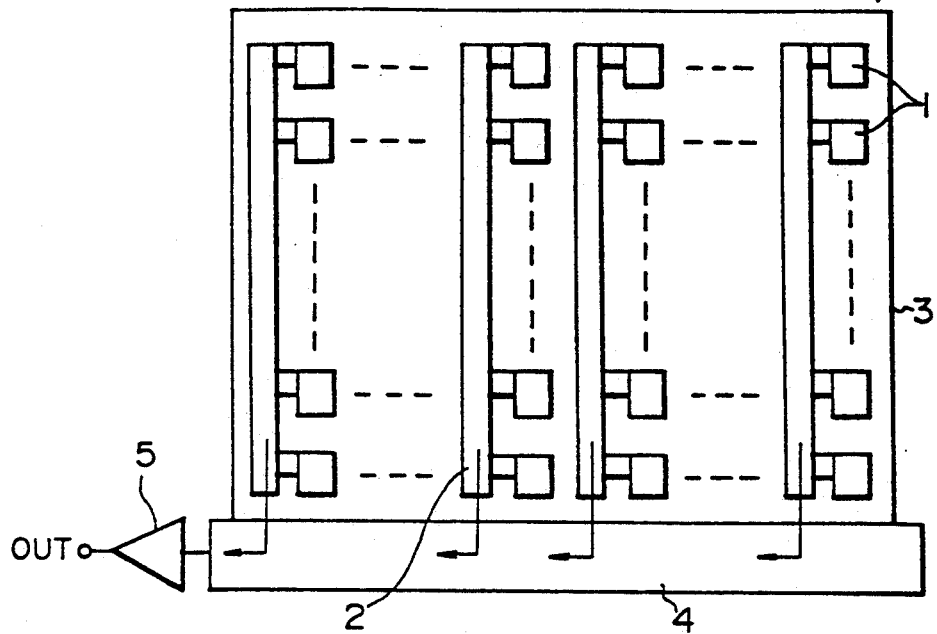
FIG. 3 is a typical view of a prior art CCD image sensor of an interline transfer system.
Figure 4:
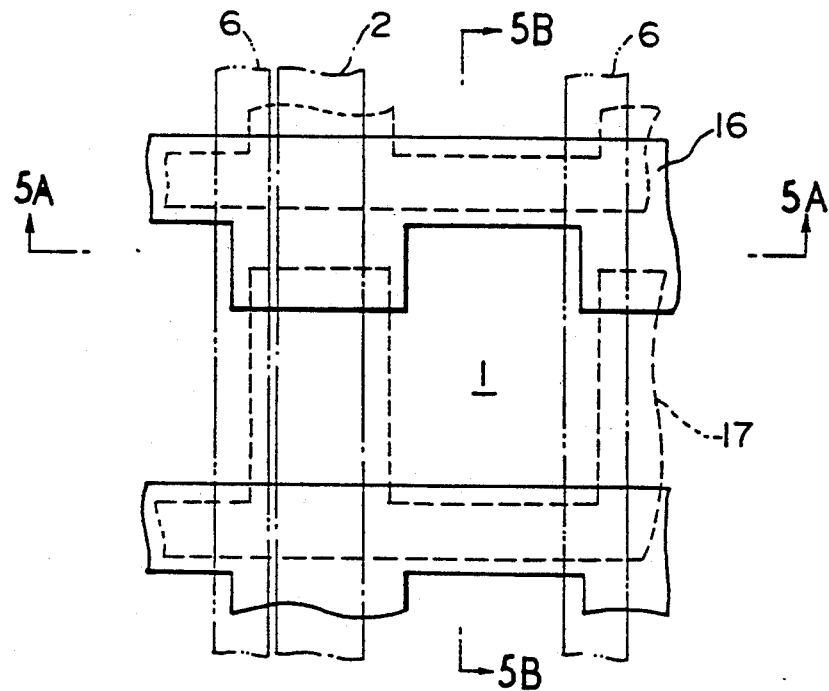
FIG. 4 is a plan view of a sensor element, corresponding to one picture element, of the CCD image sensor of FIG. 3.

A CCD image sensor in a preferred embodiment according to the present invention is a CCD image sensor provided with an image sensing unit of a HAD construction featured by the structure of the sensor elements.

Referring to FIGS. 1(a) to 2(b), a p-type region 12 is formed on an n-type silicon substrate 11. A sensor element 1 consists of a shallow p+-type hole accumulating layer 13 formed in the surface of the p-type region 12, and an n-type electric signal charge accumulating region 14 underlying the hole accumulating layer 13. Formed between and contiguously with the hole accumulating layer 13 and the electric signal charge accumulating region 14 is a p-type channel stop region 6.

As shown in FIGS. 1(a) and 1(b), a heavily doped p+-type HCS (heavy channel stop) region 19 as an additional region is formed between the adjacent sensor elements 1 in the same vertical row so as to connect the hole accumulating layers 13 of the sensor elements 1 in the same vertical row. Preferably, the impurity concentration of the hole accumulating layer 13 of the sensor element 1 is higher than that of the HCS region 19 in view of avoiding adverse influence on an associated vertical shift register 2.

Figure 5A:
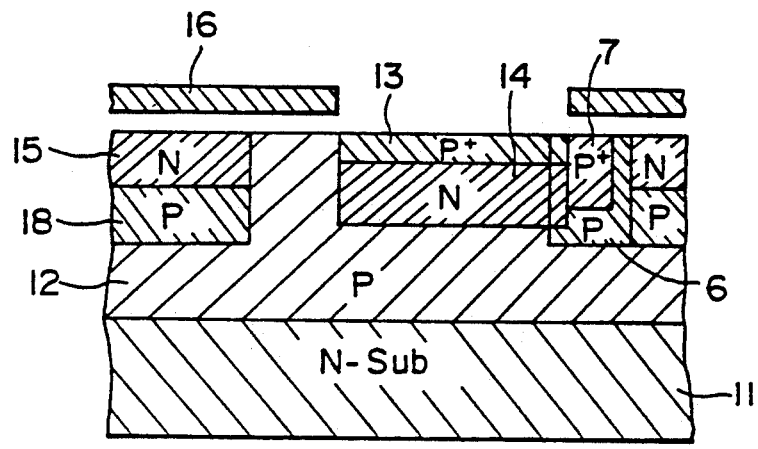
FIG. 5(a) is a sectional view taken on line X—X in FIG. 4, showing a portion, corresponding to one picture element, of the image sensing unit of a prior art CCD image sensor.
Figure 5B:
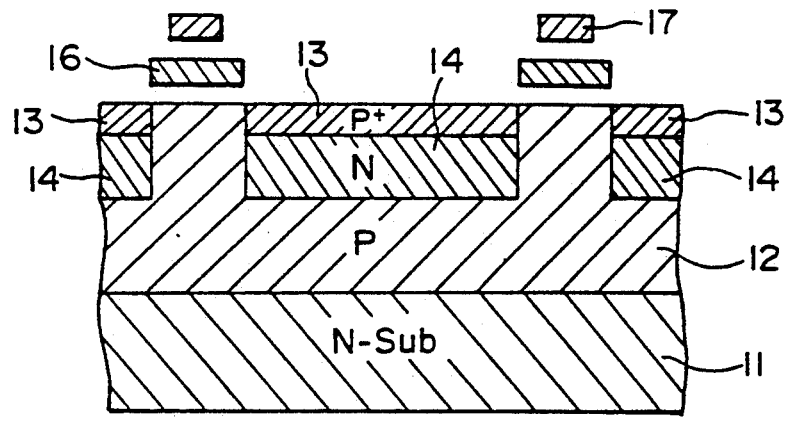
FIG. 5(b) is a sectional view taken on line Y—Y in FIG. 4, showing a portion of the image sensing unit corresponding to one picture element.

The horizontal width, i.e., the size measured along the line X—X, of the HCS region 19 may be not less than the width of the channel stop region 6. As best shown in FIG. 1(a), the HCS region 19 need not be formed in the entire area between the sensor elements 1; the HSC region 19 may be formed in a portion of the area between the sensor elements 1. Preferably, the HCS region 19 is formed in an area near the channel stop region 6 and far from the vertical shift register 2. It is obvious from the construction of the prior art CCD image sensor (FIG. 5(a)) provided with the heavily doped channel stop region 7 in the inner portion of the channel stop region 6 that the resistance against the hole current produced through photoelectric conversion can be reduced if the horizontal width of the HCS region 19 is not less than the width of the channel stop region 6 and that the quantity of electric charges in the vertical shift register is expected to be reduced if the HCS region 19 is formed in an area excessively near to the vertical shift register 2.

The vertical shift register 2 consists of an n-type electric signal charge transfer region 15 formed in the surface of the p-type region 12, and a transfer electrode 16 formed on an insulating layer, not shown, formed of $SiO_2$ over the surface of the p-type region 12. As best shown in FIG. 1(a) and 1(b), a vertical transfer electrode for the vertical transference of electric signal charges consists of the transfer electrode 16 and a transfer electrode 17 formed of polycrystalline silicon in two layers. A p-type region 18 is formed below the vertical shift register 2, namely, under the electric signal charge transfer region 15, to suppress smear.

As mentioned above, since the HCS regions 19 are formed additionally between the adjacent sensor elements 1 in the vertical row to use the hole accumulating layer 13 of the sensor element 1 as a passage for holes produced by photoelectric conversion and as means for suppressing dark current in the sensor element 1, a passage having a sufficient capacity can be secured for holes produced by photoelectric conversion and the resistance against the hole current can be reduced to a satisfactorily low extent. Thus, since the channel stop regions need not be heavily doped, problems attributable to the reduction of the quantity of electric charges in the vertical shift registers 2 and the necessity of increasing the amplitude of a pulse to be applied to the silicon substrate 11 in performing an electronic shutter operation to discharge the electric signal charges accumulated in the sensor elements 1 to the silicon substrate 11 do not arise, and it is possible to suppress anomalous increase in the quantity of electric charges to be dealt with by the sensor elements 1 when a large quantity of light falls on the CCD image sensor.

The applicant of the present patent application proposed a CCD image sensor previously in Japanese Patent Application No. Hei 2-309155. This previously proposed CCD image sensor is provided with a hole accumulating layer 13 in common to the sensor elements 1 in each vertical row. In fabricating this CCD image sensor, the hole accumulating layer 13 for the sensor elements 1 must be formed before forming polycrystalline silicon electrodes 16 and 17. The impurity of the highly doped p+-type hole accumulating layer 13 diffuses and an n+-type layer included in the sensor element 1 disappears when the hole accumulating layer 13 is subjected to heat treatment. Accordingly, the process temperature of processes following the process of forming the hole accumulating layer 13 must be must be limited to a level that may not cause the diffusion of the impurity of the hole accumulating layer 13, which, however, is very difficult.

On the other hand, the CCD image sensor of the present invention is provided with the HCS regions 19 between the hole accumulating layers 13 of the adjacent sensor elements 1 arranged in a vertical row. Therefore, the sensor elements 1 are not affected significantly by the temperature of the process of forming the HCS regions 19 even if the temperature is relatively high.

As is apparent from the foregoing description, the CCD image sensor in accordance with the present invention is provided with the additional heavily doped regions of the same type of conduction as that of the hole accumulating layer between the sensor elements arranged in a vertical row. Therefore, a passage having a sufficiently large capacity for holes produced through photoelectric conversion is secured, the resistance against the hole current is reduced to a satisfactorily low extent and hence the impurity concentration of the channel stop regions need not be very high. Accordingly, reduction in the quantity of electric charges to be dealt with by the vertical shift registers due to the diffusion of the impurity of the heavily doped channel stop regions does not occur, the amplitude of the pulse to be applied to the substrate in performing an electronic shutter operation need not be increased and the anomalous increase of the quantity of electric charges to be dealt with by the sensor elements when a large quantity of light falls on the CCD image sensor can be suppressed.

Although the invention has been described in its preferred form with a certain degree of particularity, obviously many changes and variations are possible therein. It is therefore to be understood that the present invention may be practiced otherwise than as specifically described herein without departing from the spirit and scope thereof.

What is claimed is:

1. A charge coupled device image sensor comprising:
   a plurality of sensor elements each consisting of a hole accumulating layer of a first conductivity type and an electrical signal charge accumulating region of a second conductivity type underlying the hole accumulating layer, and arranged in vertical and horizontal rows at intervals;
   vertical transfer registers each formed along and on one side of each vertical row of sensor elements to transfer electrical signal charges read from the sensor elements in the corresponding vertical row in a vertical direction; and
   channel stopper regions of said first conductivity type each formed along and on the other side of each vertical row of sensor elements to receive holes produced in the sensor elements;
   wherein doped regions of said first conductivity type are each formed in areas between the sensor elements on each vertical row; and wherein the impurity concentration of the doped regions is higher than that of the channel stopper regions and is lower than that of the hole accumulating layer.

2. A charge coupled device according to claim 1, wherein the horizontal width of the doped regions is not less than the width of the channel stopper regions.

* * * * *